(12) United States Patent
Nagai et al.

(10) Patent No.: US 8,038,799 B2
(45) Date of Patent: Oct. 18, 2011

(54) SUBSTRATE PROCESSING APPARATUS AND SUBSTRATE PROCESSING METHOD

(75) Inventors: Tatsuo Nagai, Tokyo (JP); Hiroshi Morita, Tokyo (JP); Hiroaki Takahashi, Kyoto (JP); Hiroaki Uchida, Kyoto (JP); Toyohide Hayashi, Kyoto (JP)

(73) Assignees: Kurita Water Industries Ltd. (JP); Dainippon Screen Mfg. Co., Ltd. (JP)

( * ) Notice: Subject to any disclaimer, the term of this patent is extended or adjusted under 35 U.S.C. 154(b) by 271 days.

(21) Appl. No.: 12/440,400

(22) PCT Filed: Sep. 5, 2007

(86) PCT No.: PCT/JP2007/067315
§ 371 (c)(1),
(2), (4) Date: Mar. 6, 2009

(87) PCT Pub. No.: WO2008/029848
PCT Pub. Date: Mar. 13, 2008

(65) Prior Publication Data
US 2010/0175714 A1    Jul. 15, 2010

(30) Foreign Application Priority Data
Sep. 6, 2006 (JP) ................. 2006-241798

(51) Int. Cl.
*C23G 1/02* (2006.01)
(52) U.S. Cl. ............... 134/3; 134/2; 216/83; 438/689
(58) Field of Classification Search ............ 134/2, 3, 134/94.1, 98.1, 100.1, 102.1, 103.1, 137, 134/149, 198, 902; 216/83; 156/345.11; 438/689
See application file for complete search history.

(56) References Cited

U.S. PATENT DOCUMENTS
4,085,016 A * 4/1978 Janjua et al. ............ 205/472
(Continued)

FOREIGN PATENT DOCUMENTS
JP      5-139707       6/1993
(Continued)

OTHER PUBLICATIONS

Notification Concerning Transmittal of International Preliminary Report on Patentability (Chapter I of the Patent Cooperation Treaty) together with annexed papers (PCT/IB/326) mailed Mar. 19, 2009 in corresponding International Application No. PCT/JP2007/067315 (English language).

(Continued)

*Primary Examiner* — Michael Barr
*Assistant Examiner* — Saeed T Chaudhry
(74) *Attorney, Agent, or Firm* — Ostrolenk Faber LLP

(57) ABSTRACT

A substrate processing apparatus and a substrate processing method, with which a resist can be removed satisfactorily from the substrate and a processing solution used for removing the resist can be recycled, are provided. The substrate processing apparatus includes: a substrate holding means holding a substrate; a peroxosulfuric acid generating means generating a peroxosulfuric acid using sulfuric acid; a mixing means mixing the peroxosulfuric acid generated by the peroxosulfuric acid generating means and sulfuric acid of higher temperature and higher concentration than the sulfuric acid used in the peroxosulfuric acid generating means; and a discharging means discharging, toward the substrate held by the substrate holding means, the mixed solution of the peroxosulfuric acid and the sulfuric acid mixed by the mixing means as a processing solution for removing a resist from the substrate.

3 Claims, 4 Drawing Sheets

U.S. PATENT DOCUMENTS

| | | | |
|---|---|---|---|
| 5,523,518 A | 6/1996 | Shikami et al. | |
| 2006/0066203 A1* | 3/2006 | Uno et al. | 313/311 |
| 2007/0045231 A1* | 3/2007 | Wada | 216/83 |
| 2007/0224792 A1* | 9/2007 | Tomita et al. | 438/594 |
| 2008/0251108 A1 | 10/2008 | Nagai et al. | |

FOREIGN PATENT DOCUMENTS

| | | |
|---|---|---|
| JP | 6-183704 | 7/1994 |
| JP | 2001-192874 | 7/2001 |
| JP | 2004-288858 | 10/2004 |
| JP | 2005-032819 | 2/2005 |
| JP | 2005-093926 | 4/2005 |
| JP | 2005-109166 | 4/2005 |
| JP | 2005-109167 | 4/2005 |
| JP | 2005-268308 | 9/2005 |
| JP | 2006-111943 | 4/2006 |
| JP | 2006-114880 | 4/2006 |
| JP | 2006-228899 | 8/2006 |

OTHER PUBLICATIONS

Notification of Transmittal of Translation of the International Preliminary Report on Patentability (Chapter I or Chapter II of the Patent Cooperation Treaty) (PCT/IB/338) mailed on Mar. 26, 2009 in corresponding International Application No. PCT/JP2007/067315 (English language).

International Search Report with English Language translation, Mar. 17, 2009.

Written Opinion, Mar. 17, 2009.

* cited by examiner

SUBSTRATE PROCESSING APPARATUS AND SUBSTRATE PROCESSING METHOD

CROSS REFERENCE TO RELATED APPLICATIONS

The present application is a 35 U.S.C. §371 national phase conversion of PCT/JP2007/067315 filed Sep. 5, 2007 and claims priority of JP2006-241798 filed Sep. 6, 2006, both incorporated herein in their entirety.

TECHNICAL FIELD

The present invention relates to a substrate processing apparatus and a substrate processing method used for removing a resist that has become unnecessary from a substrate. Substrates subject to processing include, for example, semiconductor wafers, liquid crystal display device substrates, plasma display substrates, FED (Field Emission Display) substrates, optical disk substrates, magnetic disk substrates, magneto-optical disk substrates, photomask substrates, etc.

PRIOR ART

Steps for manufacturing a semiconductor device include, for example, a step of locally implanting an impurity (ions), such as phosphorus, arsenic, boron, etc., in a top surface of a semiconductor wafer (referred to hereinafter simply as "wafer"). In this step, a resist, made of a photosensitive resin, is formed in a pattern on the wafer top surface to prevent ion implantation at undesired portions, and the portions at which ion implantation is not desired is masked by the resist. Because the resist formed in a pattern on the wafer top surface becomes unnecessary after the ion implantation, a resist removing process for removing the unnecessary resist on the wafer top surface is performed after the ion implantation.

As methods for the resist removing process, there are batch methods, with which a plurality of substrates are processed in a batch, and single substrate methods, with which one substrate is processed at a time. Although batch methods are conventionally the mainstream methods, because a batch method requires a large processing tank that can house the substrates and because the substrates subject to processing have become large recently, single substrate methods, which do not require such a large processing tank, are coming to be noted.

In a single substrate resist removing process, while a wafer is rotated at a fixed rotation speed about a rotation axis line orthogonal to a center of the wafer, an SPM (sulfuric acid/hydrogen peroxide mixture) is supplied from a nozzle to a central portion of a top surface of the wafer. A mixing valve is interposed in an intermediate portion of a piping connected to the nozzle, sulfuric acid and hydrogen peroxide solution are supplied to the mixing valve, and by these mixing and reacting, the SPM containing a component with an oxidative power, such as peroxomonosulfuric acid (Caro's acid), etc., is produced. The SPM supplied to the nozzle from the mixing valve rises in temperature due to a heat of reaction of the sulfuric acid and the hydrogen peroxide solution while flowing through the piping, and the SPM that is raised in temperature is supplied to the top surface of the wafer. The SPM supplied to the wafer top surface receives a centrifugal force due to rotation of the wafer, flows along the wafer top surface from the central portion to a peripheral edge, and is speedily distributed across an entirety of the wafer top surface. The resist formed on the wafer top surface is peeled and removed from the wafer top surface by the oxidative power of the SPM.

Patent Document 1: Japanese Unexamined Patent Publication No. 2005-109167

DISCLOSURE OF THE INVENTION

Problems to be Solved

However, with a wafer on which ion implantation (especially, ion implantation of high dose) has been performed, the resist top surface is modified (hardened) and in some cases, the resist cannot be removed satisfactorily from the wafer top surface even when the SPM is supplied.

Further, because the SPM contains hydrogen peroxide component, it not only cannot be reused in the resist removing process but waste solution treatment thereof is also difficult.

Thus, an object of the present invention is to provide a substrate processing apparatus and a substrate processing method, with which a resist can be removed satisfactorily from the substrate and a processing solution used for removing the resist can be reused.

Means to Solve the Problems

A substrate processing apparatus according to one aspect of the present invention includes: a substrate holding means holding a substrate; a peroxosulfuric acid generating means generating a peroxosulfuric acid using sulfuric acid; a mixing means mixing the peroxosulfuric acid generated by the peroxosulfuric acid generating means and sulfuric acid of higher temperature and higher concentration than the sulfuric acid used in the peroxosulfuric acid generating means; and a discharging means discharging, toward the substrate held by the substrate holding means, the mixed solution of the peroxosulfuric acid and the sulfuric acid mixed by the mixing means as a processing solution for removing a resist from the substrate.

At a high temperature state of not less than 120° C., peroxydisulfuric acid ($S_2O_8^{2-}$) contained in the peroxosulfuric acid exhibits a strong oxidative power capable of peeling a resist having a hardened layer on its top surface. A concentration of the peroxydisulfuric acid in the peroxosulfuric acid hardly decreases at a temperature of not more than 80° C. but decreases with the elapse of time in higher temperature states. For example, if the temperature of the peroxosulfuric acid is approximately 170° C., the concentration of the peroxydisulfuric acid decreases to half in only a few seconds. Thus, in a configuration where the peroxosulfuric acid is temperature adjusted to a high temperature of not less than 120° C. and stored in a storage tank, and the peroxosulfuric acid stored in the storage tank is supplied as the processing solution to a substrate, a processing solution containing the peroxydisulfuric acid at a high concentration must be supplied to the substrate.

With the above-described configuration, the peroxosulfuric acid and the sulfuric acid of higher temperature and higher concentration than the sulfuric acid used for generating the peroxosulfuric acid are mixed, and the mixed solution is supplied to the substrate as the processing solution for removing the resist from the substrate. When the peroxosulfuric acid and the high-temperature/high-concentration sulfuric acid are mixed, a heat of dilution is generated due to dilution of the high-temperature/high-concentration sulfuric acid by the peroxosulfuric acid, and by the heat of dilution and the heat possessed by the high-temperature/high-concentration sulfuric acid, the mixed solution (processing solution) of the peroxosulfuric acid and the high-temperature/high-concentration sulfuric acid rapidly rises in temperature to a high temperature not less than a liquid temperature of the high-temperature/high-concentration sulfuric acid. Thus, even if the liquid temperature of the peroxosulfuric acid is not more than 80° C., if the liquid temperature of the high-temperature/high-concentration sulfuric acid is adequately high, the liquid temperature of the processing solution can be raised at once to a high temperature of not less than 120° C. during mixing of the peroxosulfuric acid and the high-temperature/high-concentration sulfuric acid. By the processing solution, which has been raised in temperature to the high temperature, being discharged by the discharging means toward the substrate immediately after the temperature rise, the processing solution containing the peroxydisulfuric acid at a high concentration can be supplied to the substrate. Thus, even if the top surface of the resist is modified by ion implantation of high dose, the resist can be peeled and removed satisfactorily from the substrate by the strong oxidative power of the peroxydisulfuric acid.

Further, because the processing solution that is a mixed solution of the peroxosulfuric acid and the high-temperature/high-concentration sulfuric acid does not contain hydrogen peroxide component and contains only sulfuric acid based components, by performing an appropriate recycling process after use in the resist removing process, the processing solution can be reused in subsequent resist processing.

The means generating peroxosulfuric acid may include electrolysis cells for electrolyzing the sulfuric acid.

With this configuration, by electrolyzing the sulfuric acid in the electrolysis cells, the peroxosulfuric acid can be generated readily.

The sulfuric acid used for generating the peroxosulfuric acid is preferably a low-concentration sulfuric acid with a concentration of 2 to 11 mol/l. Because a high amount of sulfate ions of 0.5 to 2.0 mol/l is present in sulfuric acid with a concentration of 2 to 11 mol/l, by using a low-concentration sulfuric acid with such a concentration, efficiency of peroxydisulfuric acid generation can be improved.

The electrolysis cells preferably have an electrode formed of diamond.

The electrode formed of diamond may be formed solely of diamond or formed by coating a top surface of a conductive substrate with diamond.

With this configuration, the electrode included in the electrolysis cells is formed using diamond. By using such an electrode, the peroxosulfuric acid can be generated efficiently. Elution of impurities from the electrode can also be suppressed.

The peroxosulfuric acid generating means may include an ozone dissolving means that dissolves ozone into the sulfuric acid.

With this configuration, ozone can be dissolved into the sulfuric acid, and the peroxosulfuric acid can be generated by the dissolution of ozone.

The substrate holding means may also be configured to rotate a single substrate while holding the same.

A substrate processing method according to another aspect of the present invention includes: a peroxosulfuric acid generating step of generating a peroxosulfuric acid by using sulfuric acid; and a supplying step of mixing the peroxosulfuric acid generated in the peroxosulfuric acid generating step and sulfuric acid of higher temperature and higher concentration than the sulfuric acid used in the peroxosulfuric acid generating step and, immediately after mixing, supplying the mixed solution as a processing solution for removing a resist from a substrate to the substrate.

This method can be implemented in the substrate processing apparatus described above and by implementing this method, the resist can be peeled and removed satisfactorily from the substrate.

The sulfuric acid used in the peroxosulfuric acid generating step preferably has a concentration of 2 to 11 mol/l. By using the low-concentration sulfuric acid with a concentration of 2 to 11 mol/l to generate the peroxosulfuric acid, the efficiency of peroxydisulfuric acid generation can be improved as described above.

Further, in the supplying step, a concentration of the peroxosulfuric acid in the mixed solution is preferably 10 to 150 g/l. By making the concentration of the peroxosulfuric acid 10 to 150 g/l, reactivity of the peroxosulfuric acid and the resist can be improved and time required for removing the resist can be shortened.

The foregoing and other objects, features, and effects of the present invention will become more apparent from the following detailed description of the embodiments with reference to the attached drawings.

DESCRIPTION OF THE REFERENCE NUMERALS

1 Substrate processing apparatus
2 Spin chuck
3 Nozzle
8 Mixing valve
12 Peroxosulfuric acid generating tank
17 Anode
18 Cathode
31 Bubbler
32 Ozone gas supply valve

BEST MODE FOR CARRYING OUT THE INVENTION

Embodiments of the present invention shall now be described in detail with reference to the attached drawings.

Figure 1:
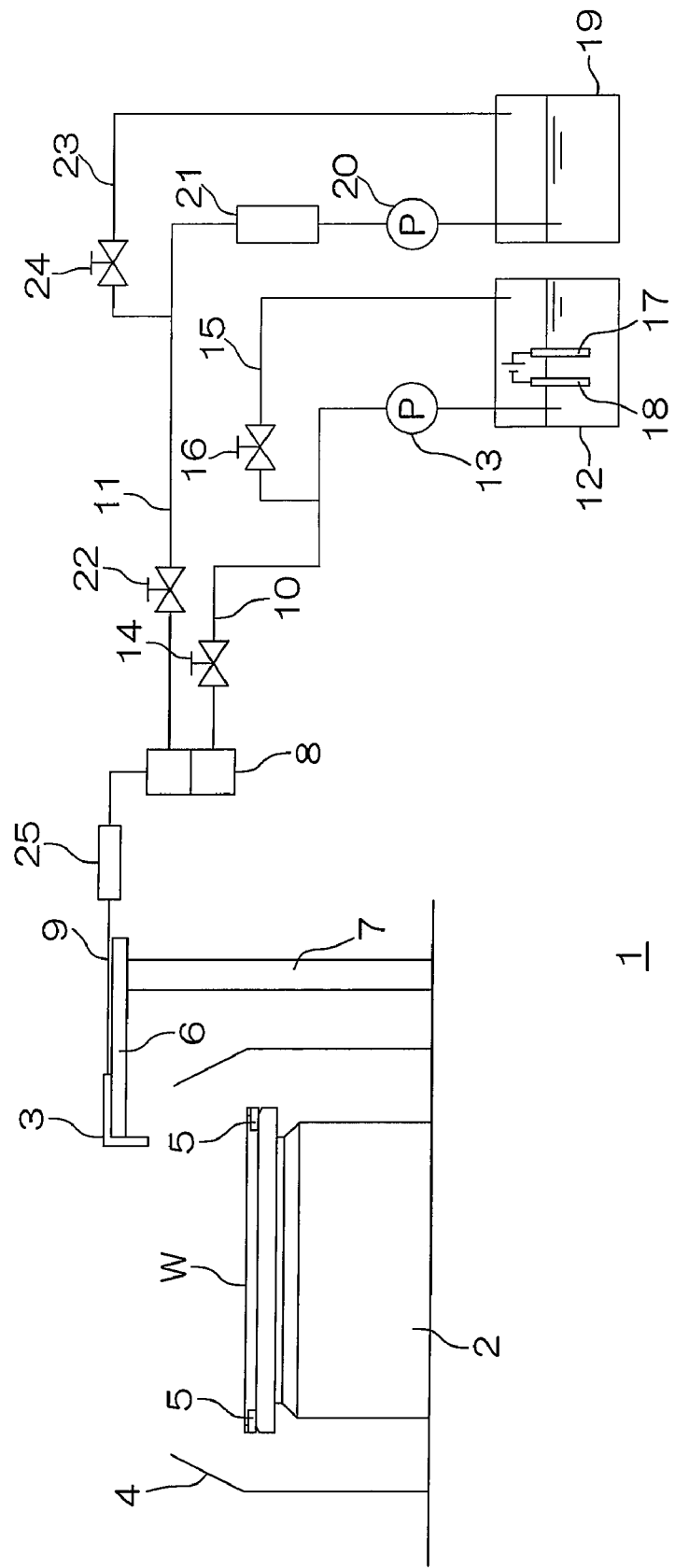
FIG. 1 A schematic sectional view of a configuration of a substrate processing apparatus according to a first embodiment of the present invention.

FIG. 1 is a schematic sectional view of a configuration of a substrate processing apparatus according to a first embodiment of the present invention.

The substrate processing apparatus 1 is a single substrate apparatus and is used for a process for removing a resist that has become unnecessary from a top surface of a wafer W, which is an example of a substrate. The substrate processing apparatus 1 includes a spin chuck 2 for rotating the wafer W while holding it substantially horizontally, a nozzle 3 for supplying a processing solution onto the top surface of the wafer W held by the spin chuck 2, and a cup 4 surrounding a circumference of the spin chuck 2 and being for receiving the processing solution that flows downward or splashes from the wafer W.

The spin chuck 2 has a clamping type configuration, can hold the wafer W in a substantially horizontal posture by clamping the wafer W by a plurality of clamps 5 and, by rotating about a substantially vertical axial line in this state, can rotate the held wafer W while maintaining it in the substantially horizontal orientation.

As the spin chuck 2, a vacuum suction type configuration (vacuum chuck), which maintains the wafer W in a substantially horizontal orientation by vacuum suction of a lower surface of the wafer W and, by rotating about a substantially vertical axial line in this state, can rotate the held wafer W while maintaining it in the substantially horizontal orientation, may be employed.

The nozzle 3 is mounted on a front end of an arm 6 disposed above the spin chuck 2. The arm 6 is supported by a supporting shaft 7, extending substantially vertically at a side of the cup 4, and extends substantially horizontally from an upper end of the supporting shaft 7. The supporting shaft 7 is disposed in a manner enabling rotation about its central axis line, and by rotating the supporting shaft 7, the nozzle 3 can be positioned above the wafer W held by the spin chuck 2 or at a home position set outside the cup 4.

A front end of a processing solution supply piping 9, extending from a mixing valve 8, is connected to the nozzle 3, and a mixed solution of a peroxosulfuric acid and a high-temperature/high-concentration sulfuric acid is supplied from the processing solution supply piping 9 as shall be described below.

A peroxosulfuric acid supply piping 10 and a high-temperature/high-concentration sulfuric acid supply piping 11 are connected to the mixing valve 8.

The peroxosulfuric acid supply piping 10 extends from a peroxosulfuric acid generating tank 12 for generating the peroxosulfuric acid. A pump 13 for pumping out the peroxosulfuric acid from the peroxosulfuric acid generating tank 12 and a peroxosulfuric acid supply valve 14 for opening and closing the peroxosulfuric acid supply piping 10 are interposed in that order starting from the peroxosulfuric acid generating tank 12 side in intermediate portions of the peroxosulfuric acid supply piping 10. Further, in between the pump 13 and the peroxosulfuric acid supply valve 14, a peroxosulfuric acid return piping 15 is branched from and connected to the peroxosulfuric acid supply piping 10. A peroxosulfuric acid circulating valve 16 is interposed in an intermediate portion of the peroxosulfuric acid return piping 15. A front end of the peroxosulfuric acid return piping 15 is connected to the peroxosulfuric acid generating tank 12.

An anode 17 and a cathode 18, formed as diamond electrodes, are disposed in the peroxosulfuric acid generating tank 12. Initially, a low-concentration sulfuric acid ($H_2SO_4$) of a concentration of 4 mol/l is stored in the peroxosulfuric acid generating tank 12, and the anode 17 and the cathode 18 are immersed in the low-concentration sulfuric acid. When a DC voltage is applied across the anode 17 and the cathode 18, an oxidation reaction of sulfate ions ($SO_4^{2-}$) contained in the low-concentration sulfuric acid occurs, and a peroxosulfuric acid, containing peroxydisulfuric acid ($S_2O_8^{2-}$), which has a stronger oxidative power than peroxomonosulfuric acid, is generated.

During operation of the apparatus, the pump 13 is driven constantly and the DC voltage is constantly applied across the anode 17 and the cathode 18. Thus, while the peroxosulfuric acid supply valve 14 is closed and the peroxosulfuric acid circulating valve 16 is opened, the peroxosulfuric acid that is pumped out from the peroxosulfuric acid generating tank 12 and into the peroxosulfuric acid supply piping 10 by an action of the pump 13 is returned to the peroxosulfuric acid generating tank 12 via the peroxosulfuric acid return piping 15. The peroxosulfuric acid thus circulates along a circulating path made up of the peroxosulfuric acid generating tank 12, the peroxosulfuric acid supply piping 10, and the peroxosulfuric acid return piping 15. On the other hand, when the peroxosulfuric acid supply valve 14 is opened and the peroxosulfuric acid circulating valve 16 is closed, the peroxosulfuric acid flowing through the peroxosulfuric acid supply piping 10 passes through the peroxosulfuric acid supply valve 14 and is supplied to the mixing valve 8.

The high-temperature/high-concentration sulfuric acid supply piping 11 extends from a high-temperature/high-concentration sulfuric acid tank 19 that stores the high-temperature/high-concentration sulfuric acid ($H_2SO_4$) of, for example, a temperature of 120° C. and a concentration of 96 wt %. A pump 20 for pumping out the high-temperature/high-concentration sulfuric acid from the high-temperature/high-concentration sulfuric acid tank 19, a heater 21 for heating the high-temperature/high-concentration sulfuric acid flowing through the high-temperature/high-concentration sulfuric acid supply piping 11 by an action of the pump 20, and a high-temperature/high-concentration sulfuric acid supply valve 22 for opening and closing the high-temperature/high-concentration sulfuric acid supply piping 11, are interposed in intermediate portions of the high-temperature/high-concentration sulfuric acid supply piping 11. Further, in between the heater 21 and the high-temperature/high-concentration sulfuric acid supply valve 15, a high-temperature/high-concentration sulfuric acid return piping 23 is branched from and connected to the high-temperature/high-concentration sulfuric acid supply piping 11. A high-temperature/high-concentration sulfuric acid circulating valve 24 is interposed in an intermediate portion of the high-temperature/high-concentration sulfuric acid return piping 23. A front end of the high-temperature/high-concentration sulfuric acid return piping 23 is connected to the high-temperature/high-concentration sulfuric acid tank 19.

During operation of the apparatus, the pump 20 and the heater 21 are driven constantly. Thus, while the high-temperature/high-concentration sulfuric acid supply valve 22 is closed and the high-temperature/high-concentration sulfuric acid circulating valve 24 is opened, the high-temperature/high-concentration sulfuric acid that is pumped out from the high-temperature/high-concentration sulfuric acid tank 19 and into the high-temperature/high-concentration sulfuric acid supply piping 11 by the action of the pump 20 is returned to the high-temperature/high-concentration sulfuric acid tank 19 via the high-temperature/high-concentration sulfuric acid return piping 23. The high-temperature/high-concentration sulfuric acid thus circulates along a circulating path made up of the high-temperature/high-concentration sulfuric acid tank 19, the high-temperature/high-concentration sulfuric acid supply piping 11, and the high-temperature/high-concentration sulfuric acid return piping 23. By thus circulating the high-temperature/high-concentration sulfuric acid, the high-temperature/high-concentration sulfuric acid can be temperature adjusted at a fixed temperature (120° C. in the present embodiment), and the high-temperature/high-concentration sulfuric acid that is temperature adjusted can thus be stored in the high-temperature/high-concentration sulfuric acid tank 19. On the other hand, when the high-temperature/high-concentration sulfuric acid supply valve 22 is opened and the high-temperature/high-concentration sulfuric acid circulating valve 24 is closed, the high-temperature/high-concentration sulfuric acid flowing through the high-temperature/high-concentration sulfuric acid supply piping 11 passes through the high-temperature/high-concentration sulfuric acid supply valve 22 and is supplied to the mixing valve 8.

The peroxosulfuric acid from the peroxosulfuric acid supply piping 10 and the high-temperature/high-concentration sulfuric acid from the high-temperature/high-concentration sulfuric acid supply piping 11 are supplied at a volume ratio of 2:1 to 1:4 (peroxosulfuric acid:high-temperature/high-concentration sulfuric acid) to the mixing valve 8. When the peroxosulfuric acid and the high-temperature/high-concentration sulfuric acid are supplied to the mixing valve 8, these become mixed, and a mixed solution thereof flows out from the mixing valve 8 to the processing solution supply piping 9. In this process, a heat of dilution is generated due to dilution of the high-temperature/high-concentration sulfuric acid by the peroxosulfuric acid, and by the heat of dilution and the heat possessed by the high-temperature/high-concentration sulfuric acid, the mixed solution of the peroxosulfuric acid and the high-temperature/high-concentration sulfuric acid rapidly rises in temperature to a high temperature not less than a liquid temperature of the high-temperature/high-concentration sulfuric acid.

An agitation communication pipe 25 for agitating the mixed solution of the peroxosulfuric acid and the high-temperature/high-concentration sulfuric acid flowing out from the mixing valve 8 is interposed in an intermediate portion of the processing solution supply piping 9.

The agitation communication pipe 25 has a configuration, for example, where a plurality of agitating fins, each made of a rectangular plate-like member twisted at substantially 180 degrees about a liquid flowing direction as an axis, are disposed inside a pipe member while being offset with respect to each other by 90 degrees in rotation angle about a pipe central axis extending along the liquid flowing direction. As the agitation communication pipe 25 with such a configuration, for example, a product of the trade name, "MX Series: Inline Mixer," manufactured by Advance Electric Co., Inc. may be used. By the agitation communication pipe 25 being interposed, the peroxosulfuric acid and the high-temperature/high-concentration sulfuric acid in the mixed solution (processing solution) supplied toward the nozzle 3 can be mixed uniformly.

Figure 2:
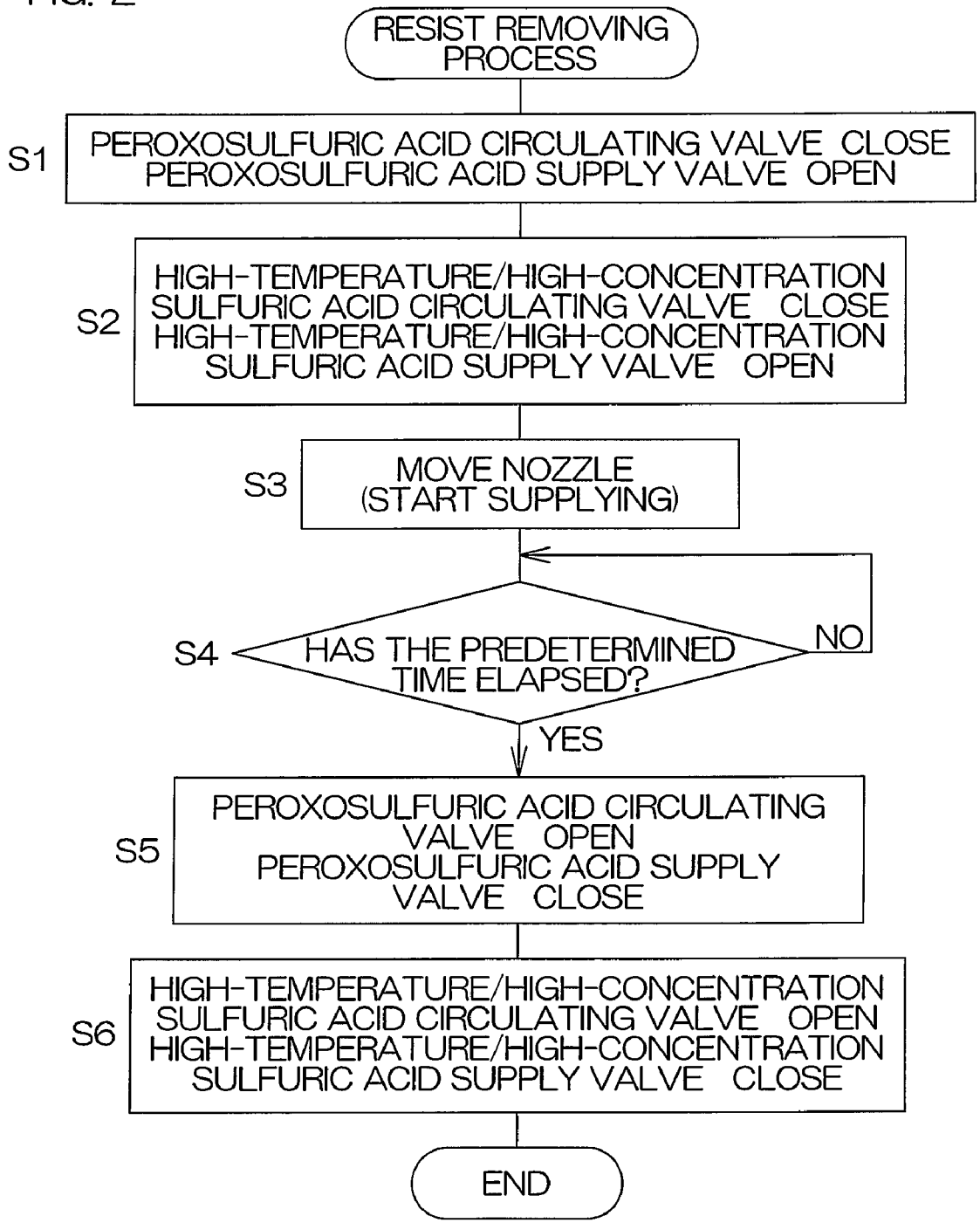
FIG. 2 A diagram for describing a resist removing process in the substrate processing apparatus shown in FIG. 1.

FIG. 2 is a diagram for describing a resist removing process in the substrate processing apparatus 1.

In the resist removing process, a wafer W is conveyed to the substrate processing apparatus 1 by a conveying robot (not shown). The wafer W is held by the spin chuck 2 with its top surface faced upward.

Before the wafer W is held by the spin chuck 2, the peroxosulfuric acid supply valve 14 is closed, the peroxosulfuric acid circulating valve 16 is opened, and the peroxosulfuric acid circulates along the circulating path made of the peroxosulfuric acid generating tank 12, the peroxosulfuric acid supply piping 10, and the peroxosulfuric acid return piping 15. Further, the high-temperature/high-concentration sulfuric acid supply valve 22 is closed, the high-temperature/high-concentration sulfuric acid circulating valve 24 is opened, and the high-temperature/high-concentration sulfuric acid circulates along the circulating path made of the high-temperature/high-concentration sulfuric acid tank 19, the high-temperature/high-concentration sulfuric acid supply piping 11, and the high-temperature/high-concentration sulfuric acid return piping 23. Furthermore, the nozzle 3 is positioned at the home position set outside the cup 4 and opposes a predispense pod (not shown) disposed at the home position.

When the wafer W is held by the spin chuck 2, the peroxosulfuric acid circulating valve 16 is closed and the peroxosulfuric acid supply valve 14 is opened (step S1). Furthermore, the high-temperature/high-concentration sulfuric acid circulating valve 24 is closed and the high-temperature/high-concentration sulfuric acid supply valve 22 is opened (step S2). The peroxosulfuric acid and the high-temperature/high-concentration sulfuric acid are thereby supplied to the mixing valve 8, the mixed solution thereof is fed as the processing solution to the nozzle 3 from the mixing valve 8, and along with this processing solution, a cooled processing solution left in the processing solution supply piping 9 is discharged from the nozzle 3. Because at this time, the nozzle 3 is still positioned at the home position, the processing solution discharged from the nozzle 3 is received by the predispense pod.

Meanwhile, when the wafer W is held by the spin chuck 2, rotation of the wafer W by the spin chuck 2 is started, and the wafer W is rotated at a predetermined rotation speed (for example, 500 to 1000 rpm). When a fixed time (a time adequate for discharging all of the processing solution that was left in the processing solution supply piping 9 from the nozzle 3) elapses from the holding of the wafer W by the spin chuck 2, the arm 6 swings, the nozzle 3 is moved from the home position to above the wafer W, and supplying of the processing solution, discharged from the nozzle 3, onto the top surface of the wafer W is started (step S3). Supplying of the cooled processing solution left in the processing solution supply piping 9 onto the top surface of the wafer W can thereby be prevented.

The processing solution supplied to the top surface of the wafer W receives a centrifugal force due to rotation of the wafer W and flows along the top surface of the wafer while spreading toward a circumferential edge of the wafer W from a processing solution supply position. The high-temperature processing solution is thus supplied uniformly to an entirety of the top surface of the wafer W, and the resist formed on the top surface of the wafer W is peeled and removed by the strong oxidative power of the high-temperature processing solution.

While the processing solution is being supplied to the wafer W, the nozzle 3 may be stopped above a rotation center of the wafer W, or the nozzle 3 may be moved reciprocatingly above the wafer W by repeatedly swinging the arm 6 within a predetermined angular range. In the case where the arm 6 is repeatedly swung within the predetermined angular range, the supply position of the processing solution from the nozzle 3 can be scanned (moved) accordingly along the top surface of the wafer W. The processing solution can thereby be supplied more uniformly across the entirety of the top surface of the wafer W.

When a predetermined time (for example, 30 to 120 seconds) elapses from the start of supplying of the processing solution (YES in step S4), the peroxosulfuric acid supply valve 14 is closed and the peroxosulfuric acid circulating valve 16 is opened (step S5). The high-temperature/high-concentration sulfuric acid supply valve 22 is closed and the high-temperature/high-concentration sulfuric acid circulating valve 24 is opened (step S6). Supplying of the peroxosulfuric acid and the high-temperature/high-concentration sulfuric acid to the mixing valve 8 is thereby stopped, and supplying of the processing solution from the nozzle 3 onto the top surface of the wafer W is stopped.

After the nozzle 3 is then retreated to the home position, DIW (deionized water) is supplied from an unillustrated DIW nozzle onto the top surface of the rotating wafer W and the processing solution adhering to the top surface of the wafer W is rinsed off. After the supplying of the DIW is continued for a predetermined time, the supplying of the DIW is stopped, and the speed of rotation of the wafer W by the spin chuck 2 is raised to a predetermined high rotation speed (for example, 2500 to 5000 rpm). By this high speed rotation of the wafer W, the DIW adhered to the wafer W is spun off and the wafer W is thereby dried. After this process has been performed for a predetermined time, the rotation of the wafer W by the spin chuck 2 is stopped, and after the wafer W has become still, the processed wafer W is conveyed out by a conveying robot (not shown).

As described above, with the substrate processing apparatus 1, the peroxosulfuric acid generated by electrolysis of the low-concentration sulfuric acid and the high-temperature/high-concentration sulfuric acid of higher temperature and higher concentration than the low-concentration sulfuric acid are mixed, and the mixed solution is supplied to the top surface of the wafer W. When the peroxosulfuric acid and the high-temperature/high-concentration sulfuric acid are mixed, the heat of dilution due to dilution of the high-temperature/high-concentration sulfuric acid by the peroxosulfuric acid is generated, and by the heat of dilution and the heat possessed by the high-temperature/high-concentration sulfuric acid, the mixed solution (processing solution) of the peroxosulfuric acid and the high-temperature/high-concentration sulfuric acid rises at once in temperature to a high temperature not less than 120° C. which is the liquid temperature of the high-temperature/high-concentration sulfuric acid. By the processing solution of high temperature then being discharged from the nozzle 3 toward the top surface of the wafer W immediately after the temperature rise, the processing solution containing the peroxydisulfuric acid at a high concentration can be supplied to the top surface of the wafer W. Thus, even if the top surface of the resist is modified by ion implantation of high dose, the resist can be peeled and removed satisfactorily from the substrate by the strong oxidative power of the peroxydisulfuric acid.

Preferably, the concentration of the peroxosulfuric acid in the processing solution as the mixed solution is adjusted to 10 to 150 g/l. Because the concentration in a conventionally-used SPM (sulfuric acid:hydrogen peroxide=5:1) is approximately 2 to 5 g/l, by adjusting the concentration as described above, the reactivity with the resist can be made even higher and the time required for the resist removing process can be shortened further. Further, in a case where an even higher reactivity with the resist on the wafer W is required, such as when rinsing the wafer W after performing an ion implantation process of even higher dose, the concentration of the peroxosulfuric acid is even more preferably adjusted to 30 to 150 g/l.

Further, because the processing solution that is the mixed solution of the peroxosulfuric acid and the high-temperature/high-concentration sulfuric acid does not contain hydrogen peroxide component and contains only sulfuric acid based components, by performing an appropriate recycling process after use in the resist removing process, the processing solution can be reused in subsequent resist processing. Further, a waste solution treatment for discarding the processing solution that has been used once in the resist removing process is simple.

Figure 3A:
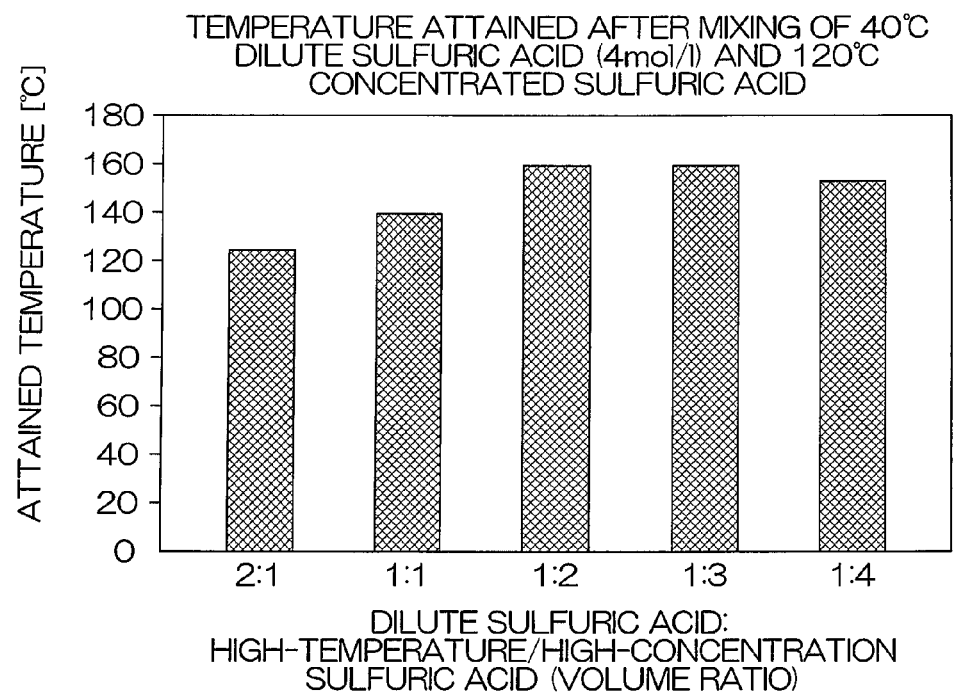
FIGS. 3(a) and 3(b) are graphs showing results of temperature rise tests.
Figure 3B:
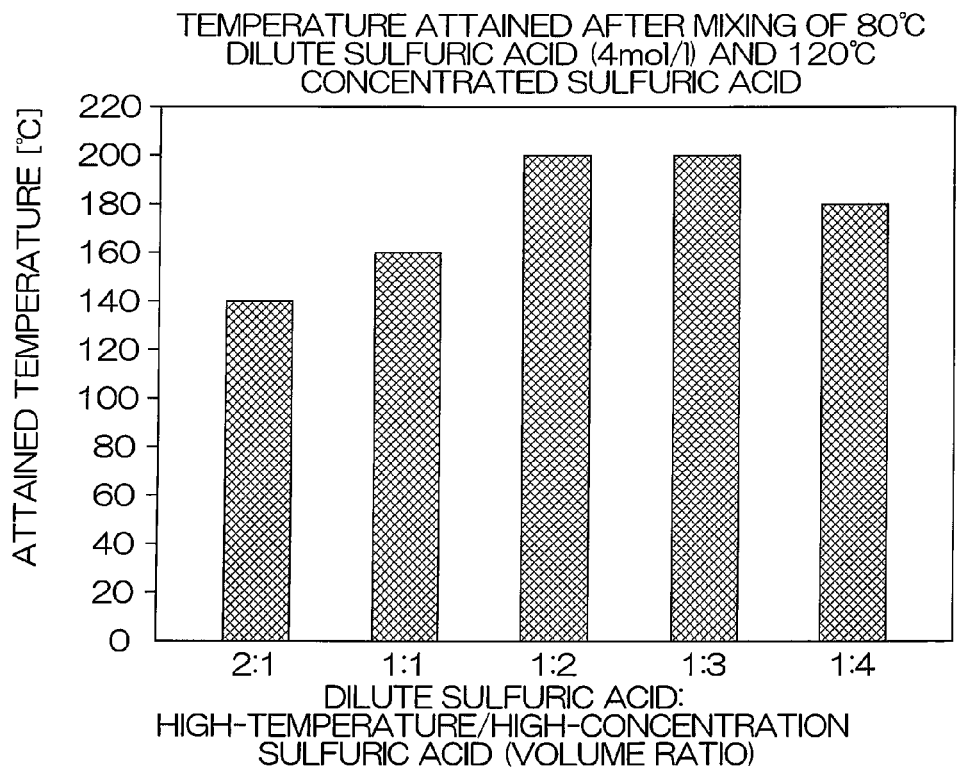

FIGS. 3(a) and 3(b) are graphs showing results of temperature rise tests.

A test of mixing a low-concentration sulfuric acid of a temperature of 40° C. and a concentration of 4 mol/l, obtained by mixing DIW and sulfuric acid of 96 wt % concentration at a volume ratio of 3.6:1, and a high-temperature/high-concentration sulfuric acid of a temperature of approximately 120° C. and a concentration of 96 wt % at volume ratios in a range of 2:1 to 1:4 and examining the liquid temperatures (attained temperatures) of the respective mixed solutions was performed (temperature rise test).

In a case where the low-concentration sulfuric acid of the temperature of 40° C. and the concentration of 4 mol/l was mixed with the high-temperature/high-concentration sulfuric acid of the temperature of approximately 120° C. and the concentration of 96 wt % at a volume ratio of 2:1, the liquid temperature of the mixed solution rose to approximately 125° C.

In a case where the low-concentration sulfuric acid of the temperature of 40° C. and the concentration of 4 mol/l was mixed with the high-temperature/high-concentration sulfuric acid of the temperature of approximately 120° C. and the concentration of 96 wt % at a volume ratio of 1:1, the liquid temperature of the mixed solution rose to approximately 140° C.

In a case where the low-concentration sulfuric acid of the temperature of 40° C. and the concentration of 4 mol/l was mixed with the high-temperature/high-concentration sulfuric acid of the temperature of approximately 120° C. and the concentration of 96 wt % at a volume ratio of 1:2, the liquid temperature of the mixed solution rose to approximately 160° C.

In a case where the low-concentration sulfuric acid of the temperature of 40° C. and the concentration of 4 mol/l was mixed with the high-temperature/high-concentration sulfuric acid of the temperature of approximately 120° C. and the concentration of 96 wt % at a volume ratio of 1:3, the liquid temperature of the mixed solution rose to approximately 160° C.

In a case where the low-concentration sulfuric acid of the temperature of 40° C. and the concentration of 4 mol/l was mixed with the high-temperature/high-concentration sulfuric acid of the temperature of approximately 120° C. and the concentration of 96 wt % at a volume ratio of 1:4, the liquid temperature of the mixed solution rose to approximately 155° C.

In FIG. 3(a), these results are indicated in a cross-hatched bar graph.

Further, a test of mixing a low-concentration sulfuric acid of a temperature of 80° C. and a concentration of 4 mol/l, obtained by mixing DIW and sulfuric acid of 96 wt % concentration at a volume ratio of 3.6:1, and a high-temperature/high-concentration sulfuric acid of a temperature of approximately 120° C. and a concentration of 96 wt % at volume ratios in a range of 2:1 to 1:4 and examining the liquid temperatures (attained temperatures) of the respective mixed solutions was performed (temperature rise test).

In a case where the low-concentration sulfuric acid of the temperature of 80° C. and the concentration of 4 mol/l was mixed with the high-temperature/high-concentration sulfuric acid of the temperature of approximately 120° C. and the concentration of 96 wt % at a volume ratio of 2:1, the liquid temperature of the mixed solution rose to approximately 140° C.

In a case where the low-concentration sulfuric acid of the temperature of 80° C. and the concentration of 4 mol/l was mixed with the high-temperature/high-concentration sulfuric acid of the temperature of approximately 120° C. and the concentration of 96 wt % at a volume ratio of 1:1, the liquid temperature of the mixed solution rose to approximately 160° C.

In a case where the low-concentration sulfuric acid of the temperature of 80° C. and the concentration of 4 mol/l was mixed with the high-temperature/high-concentration sulfuric acid of the temperature of approximately 120° C. and the concentration of 96 wt % at a volume ratio of 1:2, the liquid temperature of the mixed solution rose to approximately 200° C.

In a case where the low-concentration sulfuric acid of the temperature of 80° C. and the concentration of 4 mol/l was mixed with the high-temperature/high-concentration sulfuric acid of the temperature of approximately 120° C. and the concentration of 96 wt % at a volume ratio of 1:3, the liquid temperature of the mixed solution rose to approximately 200° C.

In a case where the low-concentration sulfuric acid of the temperature of 80° C. and the concentration of 4 mol/l was mixed with the high-temperature/high-concentration sulfuric acid of the temperature of approximately 120° C. and the concentration of 96 wt % at a volume ratio of 1:4, the liquid temperature of the mixed solution rose to approximately 180° C.

In FIG. 3(b), these results are indicated in a cross-hatched bar graph.

From the above results, it can be understood that as long as the liquid temperature of the high-temperature/high-concentration sulfuric acid is 120° C., the temperature of the mixed solution of the peroxosulfuric acid and the high-temperature/high-concentration sulfuric acid rises to not less than 120° C. even if the peroxosulfuric acid (in the tests, the low-concentration sulfuric acid of 4 mol/l is used in place of the peroxosulfuric acid) is at 40° C. It can also be understood that the higher the temperature of the peroxosulfuric acid, the higher temperature to which the temperature of the mixed solution of the peroxosulfuric acid and the high-temperature/high-concentration sulfuric acid rises.

While the present invention has been described in detail by way of the embodiments thereof, it should be understood that these embodiments are merely illustrative of the technical principles of the present invention but not limitative of the invention, and the spirit and scope of the present invention are to be limited only by the appended claims.

For example, although in the above-described embodiment, the low-concentration sulfuric acid of the concentration of 4 mol/l is electrolyzed to generate the peroxosulfuric acid, the concentration of the low-concentration sulfuric acid used to generate the peroxosulfuric acid is not restricted to 4 mol/l. However, because a high amount of sulfate ions of 0.5 to 2.0 mol/l is present in a low-concentration sulfuric acid with a concentration of 2 to 11 mol/l, by using a low-concentration sulfuric acid with such a concentration for generating sulfuric acid, efficiency of peroxydisulfuric acid generation can be improved. Further, when the concentration of sulfuric acid is in a range of 4 to 8 mol/l, an even higher amount of sulfate ions of 1.5 to 2.0 mol/l is present and the efficiency of peroxydisulfuric acid generation can be made even higher.

Further, a configuration where sulfuric acid and DIW are mixed at a mixing valve to prepare a low-concentration sulfuric acid and this low-concentration sulfuric acid is supplied to the peroxosulfuric acid generating tank 12 may be employed, and in this case, the concentration of the low-concentration sulfuric acid used to generate the peroxosulfuric acid may be made changeable by making a mixing ratio of the sulfuric acid and the DIW at the mixing valve changeable.

Furthermore, although with the above-described embodiment, the peroxosulfuric acid from the peroxosulfuric acid supply piping 10 and the high-temperature/high-concentration sulfuric acid from the high-temperature/high-concentration sulfuric acid supply piping 11 are mixed at a volume ratio of 1:1 at the mixing valve 8, for example, flow regulating valves may be interposed in intermediate portions of the peroxosulfuric acid supply piping 10 and the high-temperature/high-concentration sulfuric acid supply piping 11 to enable changing of the mixing ratio of the peroxosulfuric acid and the high-temperature/high-concentration sulfuric acid at the mixing valve 8.

Further, an example where the liquid temperature of the high-temperature/high-concentration sulfuric acid is 120° C. was described, a controller for controlling a heat generating amount of the heater 21 may be disposed to enable changing of the liquid temperature of the high-temperature/high-concentration sulfuric acid. In a case where the substrate processing apparatus 1 is used to remove a resist that has been ashed by an oxygen plasma from the top surface of the wafer W, the liquid temperature of the high-temperature/high-concentration sulfuric acid may be set to a temperature lower than 120° C.

Further, a heater may be interposed between the mixing valve 8 and the peroxosulfuric acid supply valve 14, and peroxosulfuric acid supplied to the mixing valve 8 may be heated supplementarily by the heater. By heating the peroxosulfuric acid, the liquid temperature of the processing solution that is the mixed solution of the peroxosulfuric acid and the high-temperature/high-concentration sulfuric acid can be made higher. The liquid temperature of the processing solution is preferably 120 to 200° C. and more preferably 120 to 180° C. This is because when 180° C. is exceeded, water vapor and other gases are generated in large amounts and efficiency of contact of the processing solution and the resist is lowered thereby.

Figure 4:
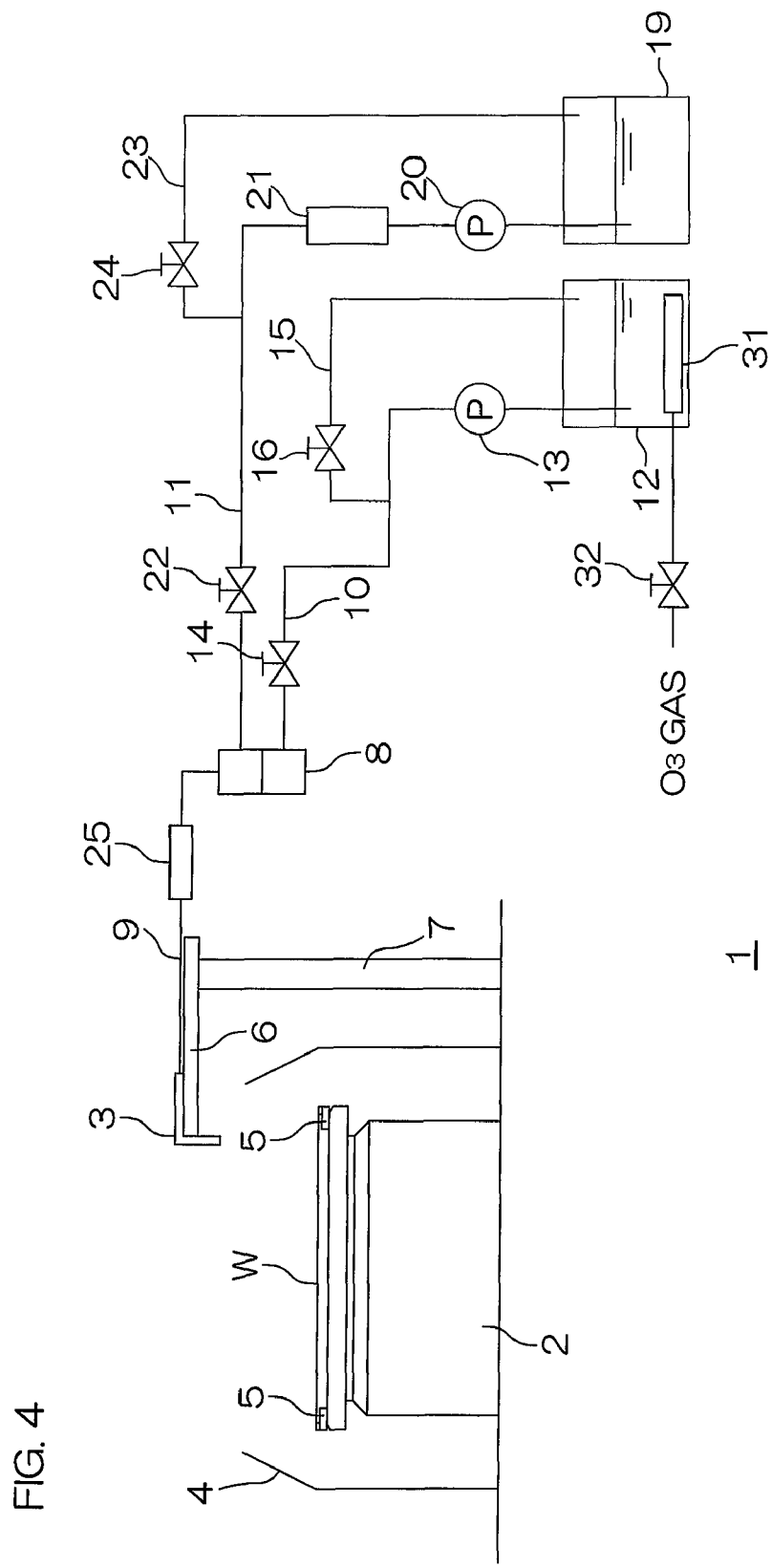
FIG. 4 A schematic sectional view of a configuration of a substrate processing apparatus according to a second embodiment of the present invention.

Although with the above-described embodiment, a configuration of generating the peroxosulfuric acid by electrolysis of the low-concentration sulfuric acid, as another embodiment, a configuration may be employed where a peroxosulfuric acid that contains peroxydisulfuric acid is generated by bubbling ozone gas into a low-concentration sulfuric acid to oxidize sulfate ions. Specifically, a configuration may be employed where, in place of the anode 17 and the cathode 18 shown in FIG. 1, a bubbler 31, serving as an ozone dissolving means, is disposed at a bottom of the peroxosulfuric acid generating tank 12 as shown in FIG. 4 and a peroxosulfuric acid that contains peroxydisulfuric acid is generated by bubbling the ozone gas supplied to the bubbler 31 via an ozone gas supply valve 32 into a low-concentration sulfuric acid stored in the peroxosulfuric acid generating tank 12.

This application corresponds to Japanese Patent Application No. 2006-241798, filed with the Japan Patent Office on Sep. 6, 2006, the disclosure of which is incorporated herein by reference.

What is claimed is:

1. A substrate processing method comprising:
    a peroxosulfuric acid generating step of generating a peroxosulfuric acid by using sulfuric acid; and
    a supplying step of mixing the peroxosulfuric acid generated in the peroxosulfuric acid generating step and sulfuric acid of higher temperature and higher concentration than the sulfuric acid used in the peroxosulfuric acid generating step to form a mixed solution, and, immediately after mixing, supplying the mixed solution to a substrate as a processing solution for removing a resist from the substrate.

2. The substrate processing method according to claim 1, wherein the sulfuric acid used in the peroxosulfuric acid generating step has a concentration of 2 to 11 mol/l.

3. The substrate processing method according to claim 1, wherein, in the supplying step, a concentration of the peroxosulfuric acid in the mixed solution is 10 to 150 g/l.

* * * * *